United States Patent
Gardner et al.

[19]

[11] Patent Number: 5,989,964
[45] Date of Patent: Nov. 23, 1999

[54] POST-SPACER LDD IMPLANT FOR SHALLOW LDD TRANSISTOR

[75] Inventors: Mark I. Gardner, Cedar Creek; Fred N. Hause, Austin, both of Tex.

[73] Assignee: Advanced Micro Devices, Inc., Sunnyvale, Calif.

[21] Appl. No.: 08/818,427

[22] Filed: Mar. 17, 1997

[51] Int. Cl.$^6$ ................................................. G01L 21/336
[52] U.S. Cl. .......................... 438/303; 438/301; 438/305; 438/306; 438/307
[58] Field of Search .................................. 438/301, 303, 438/305, 306, 307, FOR 204

[56] References Cited

U.S. PATENT DOCUMENTS

| | | | |
|---|---|---|---|
| 4,728,617 | 3/1988 | Woo et al. | 437/30 |
| 4,757,026 | 7/1988 | Woo et al. | 437/29 |
| 4,784,965 | 11/1988 | Woo et al. | 437/30 |
| 5,102,816 | 4/1992 | Manukonda et al. | 437/44 |
| 5,658,815 | 8/1997 | Lee et al. | 438/304 |
| 5,677,589 | 10/1997 | Lee et al. | 437/40 |
| 5,759,885 | 6/1998 | Son | 438/230 |
| 5,766,991 | 6/1998 | Chen | 438/231 |
| 5,770,508 | 6/1998 | Yeh et al. | 438/305 |
| 5,817,563 | 10/1998 | Lim | 439/307 |

FOREIGN PATENT DOCUMENTS

| | | | |
|---|---|---|---|
| 0218408 | 4/1987 | European Pat. Off. . | |
| 363250175 | 10/1988 | Japan | 438/204 |
| 402161733 | 6/1990 | Japan | 438/204 |
| 402206127 | 8/1990 | Japan | 438/204 |
| 8700967 | 2/1987 | WIPO . | |

OTHER PUBLICATIONS

James P., "LDD MOSFET's . . . Spacer Technology", IEEE Electron Device Letters, vol. 9, Issue 4, Apr. 1988.
*Physics of Semiconductor Devices*, Second Edition, S.M. Sze, Bell Laboratories, Inc., John Wiley & sons, 1981, pp. 431–486.

*Primary Examiner*—Wael M. Fahmy
*Assistant Examiner*—Long Pham
*Attorney, Agent, or Firm*—Kevin L. Daffer; Conley, Rose & Tayon

[57] ABSTRACT

Broadly speaking, the present invention contemplates a semiconductor manufacturing process in which LDD regions of a semiconductor transistor are implanted after the heavily doped regions without requiring the removal of spacer structures from the sidewalls of the transistor gate. A semiconductor substrate is provided. The semiconductor substrate includes a channel region laterally displaced between first and second lightly doped regions. The first and second lightly doped regions are laterally displaced between first and second heavily doped regions of the semiconductor substrate. A gate dielectric is formed on an upper surface of the semiconductor substrate. A conductive gate structure is then formed on the gate dielectric. The conductive gate structure is aligned over the channel region of the semiconductor substrate. First and second spacer structures are then formed on first and second sidewalls of the conductive gate. The first and second spacer structures extend laterally from the first and second sidewalls of the conductive gate such that the first and second spacer structures cover the first and second lightly doped regions of the semiconductor substrate. A projected range characteristic of the first and second spacer structures is greater than a projected range characteristic of the conductive gate structures. A first impurity distribution is then introduced into the semiconductor substrate. An interlevel dielectric layer is then deposited on the underlying topography and planarized. A projected range characteristic of the interlevel dielectric layer is approximately equal to a projected range characteristic of the first and second spacer structures. A second impurity distribution is then implanted into the semiconductor substrate through the interlevel dielectric layer.

17 Claims, 3 Drawing Sheets

POST-SPACER LDD IMPLANT FOR SHALLOW LDD TRANSISTOR

BACKGROUND OF THE INVENTION

1. Field of the Invention

The invention relates to the field of semiconductor fabrication and, more particularly, to a transistor having extremely shallow source/drain junction depths and a method for fabricating the transistors.

2. Description of the Related Art

Integrated circuits are widely used in the electronics industry for an extremely broad range of applications including microprocessors, integrated circuit memories, and application specific logic products. The basic building block of the integrated circuit is the MOS transistor. FIG. 10 shows a typical embodiment of a single MOS n-channel transistor. MOS transistor 10 includes a lightly doped p-type semiconductor substrate 12 a gate dielectric 16 formed on substrate 12, a conductive gate 14 formed on gate dielectric 16, n-type source region 18, and n-type drain region 20. The operation and I-V characteristics of transistor 10 are well known. With no bias applied to conductive gate 14, back-to-back p-n junctions exist between drain region 20 and source channel region 18 such that the current flow from drain region 20 to source region 18 is negligible. If, however, a positive bias is applied to conductive gate 14, mobile carriers within channel region 22 of p-type substrate 12 are repelled from the surface leaving behind a depletion region of uncompensated donor ions. If conductive gate 14 is further biased, minority carriers (i.e. electrons) are attracted to channel region 22 of substrate 12 to form a conductive inversion region near the upper surface of semiconductor substrate 12 in channel region 22. The bias required to induce an electron concentration near the surface of substrate 12 approximately equal to the whole concentration in the bulk of semiconductor substrate 12 is referred to as the threshold voltage ($V_t$). With a threshold voltage $V_t$ applied to conductive gate 14, the conductive channel in channel region 22 permits current flow from drain region 20 to source region 18 if an appropriate bias is applied between drain region 20 and source region 18. For small values of drain voltage $V_d$ (i.e. $V_d < V_g - V_t$) the current ($I_{ds}$) that flows from drain region 20 to source region 18 varies approximately linearly with the drain voltage $V_d$. For large values of drain voltage (i.e. $V_d > V_g - V_t$), $I_{ds}$ is independent of $V_d$ to a first order approximation. Applying a gate voltage $V_t$ that is less than the threshold voltage $V_t$ induces a weak inversion region in channel region 22 of semiconductor substrate 12 permitting a small but measurable subthreshold current to flow from source to drain. Subthreshold currents are particularly important (and undesirable) in low voltage, low power applications such as MOS integrated circuits because of the large number of transistors in the integrated circuit and because the sub-threshold region determines the manner in which the transistors turn on and off.

MOS transistors may be broadly characterized as either short channel or long channel devices. In a long channel device, the sub-threshold current is independent of the drain voltage, the threshold voltage is independent of the channel length and the transistor biasing, and the drain current in the saturation region is independent of the drain voltage. It will be appreciated that these characteristics of long channel devices are desirable from a manufacturing and circuit design perspective because of their tendency to minimize subthreshold currents and threshold voltage variation among transistors of varying dimensions. In contrast to long channel devices, short channel devices are characterized by a subthreshold current that varies with drain voltage, a threshold voltage that varies with channel length and biasing conditions, and a failure of current saturation in the saturation region. The following useful equation predicts the minimum channel length that can be expected to result in long channel behavior for a given set of process parameters:

$$L_{min} = 0.4[(x)(d)(W_S + W_D))^2]^{1/3}$$

where x is the junction depth, d is the oxide thickness, and $W_S + W_D$ is the sum of the source and drain junction depletion widths. See S. M. Sze., *Physics of Semiconductor Devices* pp. 431–86 (John Wiley and Sons, 1981). From this equation, its is evident that smaller transistor devices require shallower junction depths to minimize sub-threshold effects.

It will be appreciated to those skilled in the art of semiconductor processing that the MOS transistor shown in and described with respect to FIG. 10 is formed with a single source/drain implant. It will be further appreciated that MOS transistor fabrication is commonly accomplished using a pair of source/drain implants in advanced semiconductor processes. In such dual implant processes, the second source/drain impurity distribution is characterized by a greater junction depth, a higher peak impurity concentration, and a lateral displacement from the transistor channel boundaries. By displacing the deeper and more heavily doped source/drain region from the transistor channel boundary, dual implant lightly doped drain (LDD) transistors beneficially reduce the maximum electric field occurring within the transistor channel region. The critical junction depth for purposes of determining $L_{min}$ is the junction depth of the LDD regions. It is therefore desirable to minimize the junction depth of the LDD regions in LDD transistors.

Minimization of LDD junction depth is complicated by the dual implant process. The dual implant process is commonly achieved by implanting the LDD region using the transistor gate as an implant mask, forming spacer structures on sidewalls of the transistor gate, and implanting the heavily doped regions using the combined gate/spacer structure as an implant mask. Unfortunately, the implant necessary to achieve the heavily doped source/drain regions typically produces significant damage to the silicon lattice. To alleviate or remove lattice damage after a medium or high energy implant and to activate the implanted ions so that they can participate in the conduction process, a high temperature anneal is generally performed following the heavily doped implant. In a process flow where the heavily doped implant is performed after the lightly doped implant, the anneal cycle undesirably redistributes the previously implanted lightly doped regions thereby undesirably increasing the LDD junction depth. To address the redistribution of the lightly doped regions, some semiconductor processes follow a sequence in which the heavily doped implant is performed first with the spacer structures intact upon the sidewalls of the conductive gate. Thereafter, the spacer structures are removed with a wet or dry etch process so that the LDD implant will be aligned with the sidewalls of the conductive gate. Although this sequence addresses the redistribution of the LDD region, the removal of the spacer structure is difficult, if not impossible, to achieve without some degradation of gate oxide quality. More specifically, spacer structures are typically comprised of a deposited oxide and, as is well known, gate dielectrics are typically comprised of a thermal oxide. Because the composition of the gate dielectric and the spacer structures are quite similar and because of the proximity of the spacer structure to the gate dielectric, complete removal of the spacer structures cannot typically be accomplished without some inadvertent removal of the gate oxide at the perimeters of the transistor channels. In the age of deep sub-micron transistors and thin (i.e., less than 50 angstroms) gate oxides, the quality of the gate dielectric cannot be compromised without significantly degrading the quality of the overall integrated circuit. Accordingly, it is highly desirable to implement a process flow in which an LDD junction depth can be minimized without compromising the quality of the gate dielectric.

SUMMARY OF THE INVENTION

The problems identified above are in large part addressed by a semiconductor manufacturing process in which LDD regions of a semiconductor transistor are implanted after the heavily doped regions without requiring the removal of spacer structures from the sidewalls of the transistor gate. The process takes advantage of the differences in projected range characteristics of materials used for typical transistor gates, such as polysilicon and materials used for typical spacer structures, such as CVD oxide.

Broadly speaking, the present invention contemplates a source/drain fabrication method in a semiconductor manufacturing process in which a semiconductor substrate is provided. The semiconductor substrate includes a channel region that is laterally displaced between first and second lightly doped regions. The first and second lightly doped regions are, in turn, laterally displaced between first and second heavily doped regions of the semiconductor substrate. A gate dielectric is formed on an upper surface of the semiconductor substrate. A conductive gate structure is then formed on the gate dielectric. The conductive gate structure is aligned over the channel region of the semiconductor substrate. First and second spacer structures are then formed on first and second sidewalls of the conductive gate. The first and second spacer structures extend laterally from the first and second sidewalls of the conductive gate such that the first and second spacer structures cover the first and second lightly doped regions of the semiconductor substrate. A projected range characteristic of the first and second spacer structures is greater than a projected range characteristic of the conductive gate structures.

A first impurity distribution is then introduced into the semiconductor substrate. The presence of the first and second spacers structures during the introduction of the first impurity distribution substantially prevents the first impurity distribution from entering the first and second lightly doped regions. An interlevel dielectric layer is then deposited on the underlying topography, which is defined by the upper surface of the semiconductor substrate, the spacer structures, and the conductive gate. After deposition, the interlevel dielectric layer is planarized in an effort to produce an interlevel dielectric upper surface that is substantially parallel to the upper surface of the semiconductor substrate. A projected range characteristic of the interlevel dielectric layer is approximately equal to a projected range characteristic of the first and second spacer structures. A second impurity distribution is then implanted into the semiconductor substrate through the interlevel dielectric layer. The lower projected range characteristic of the conductive gate structures relative to the projected range characteristics of the spacer structures and the interlevel dielectric layer acts as an implanted mask substantially preventing the second impurity distribution from entering the channel region of the semiconductor substrate while permitting the second impurity distribution to enter the heavily doped and lightly doped regions of the semiconductor substrate.

Preferably the semiconductor substrate includes a p-type silicon epitaxial layer formed on an upper surface of a p+ silicon bulk. A preferred resistivity of the p-type epitaxial layer is in the range of approximately 10 to 15 $\Omega$-cm. The formation of the gate dielectric typically includes the thermal oxidation of the semiconductor substrate upper surface. The formation of the conductive gate suitably comprises the deposition of a polysilicon layer on an upper surface of the gate dielectric followed by a patterning of the polysilicon layer typically through the use of a photolithography and etch sequence. In one embodiment, the formation of the first and second spacer structures is accomplished by depositing a conformal dielectric layer on a topography defined by the conductive gate structure and the upper surface of the semiconductor substrate, and thereafter anisotropically etching the conformal dielectric layer to remove portions of the conformal dielectric layer in planar regions of the topography. The deposition of the conformal dielectric layer is typically accomplished by decomposing a chemical compound such as TEOS or silane in a CVD reactor chamber maintained at a temperature less than approximately 650° C. In the presently preferred embodiment, a depth of the lightly doped impurity distribution is approximately 0.1 microns.

The present invention further contemplates a MOS semiconductor process in which a gate layer is formed on a semiconductor substrate. The gate layer includes a gate dielectric layer formed on an upper surface of a silicon substrate and a conductive gate structure formed on an upper surface of the gate dielectric layer. The conductive gate structure is aligned over a channel region of the semiconductor substrate. Spacer structures are then formed on sidewalls of the conductive gate. The spacer structures extend laterally from the gate sidewalls to cover lightly doped regions of the semiconductor substrate. These lightly doped regions are laterally displaced on either side of the channel region of the semiconductor substrate. The heavily doped impurity distribution is then implanted into the heavily doped source/drain regions of the semiconductor substrate. The heavily doped source/drain regions are laterally displaced on either side of the lightly doped regions. The silicon substrate is then annealed to activate the heavily doped impurity distribution and to reduce or eliminate damage to the silicon substrate caused by the implantation of the heavily doped impurity distribution. A dielectric layer is then deposited on a topography defined by the substrate, gate structures, and the spacer structures. A lightly doped impurity distribution is then implanted into LDD regions of the silicon substrate. The lightly doped impurity distribution is implanted into the LDD region, after the annealing of the silicon substrate and without removing the spacer structures. In one embodiment, the formation of the gate layer includes depositing polysilicon on an upper surface of the gate dielectric by thermally decomposing silane in a CVD reactor chamber maintained at a temperature in the range of approximately 580° C. to 650° C. and a pressure less than approximately 2 torr. The polysilicon is then patterned with a photolithography masking step followed by a silicon etch step. The spacer structures preferably cover lightly doped regions of the semiconductor substrate. The lightly doped regions are laterally displaced on either side of a channel region of the semiconductor substrate. The implanting of the heavily doped impurity distribution is performed with an implant energy in the range of approximately 10 to 100 keV and an implant dose in the range of approximately $10^{13}$ to $10^{17}$ atoms/cm$^2$. The annealing preferably is accomplished by immersing the silicon substrate in an inert ambient maintained at a temperature in the range of approximately 600° C. to 900° C. for a duration in the range of approximately 2 to 20 minutes.

The present invention still further contemplates a method of forming shallow, lightly doped source/drain structures in which a first patterned layer is formed on an upper surface of a semiconductor substrate, a heavily doped impurity distribution is implanted into the semiconductor substrate, an interlevel dielectric is deposited, the semiconductor substrate is annealed, and a lightly doped impurity distribution is implanted into the semiconductor substrate. The first patterned layer includes a conductive gate that is aligned over a channel region of the semiconductor substrate. The first patterned layer also includes first and second spacer structures formed on respective sidewalls of the conductive gate. The spacer structures are aligned over respective lightly doped regions of the semiconductor substrate. The first and second lightly doped regions are laterally displaced on either side of the channel region. A projected range characteristic of the conductive gate is less than a projected range characteristic of the first and second spacer structures. The presence of the first patterned layer during the implanting of the heavily doped impurity distribution masks the channel region and the first and second lightly doped regions of the semiconductor substrate such that the heavily doped impurity distribution is substantially prevented from entering the channel region or the lightly doped drain regions.

After the deposition of the interlevel dielectric on the first patterned layer, the interlevel dielectric is planarized, preferably to produce an upper surface of the interlevel dielectric that is substantially parallel to the upper surface of the semiconductor substrate. The projected range characteristic of the interlevel dielectric is approximately equal to the projected range characteristic of the first and second spacer structures. After the semiconductor substrate is annealed, the lightly doped impurity distribution is implanted into the semiconductor substrate. The lower projected range characteristic of the conductive gate structure substantially prevents the lightly doped impurity distribution from entering the channel region of the semiconductor substrate. Thus, the lightly doped impurity distribution is introduced into the semiconductor substrate after annealing the heavily doped impurity distribution and without removing the spacer structures.

Preferably, the forming of the first patterned layer comprises the steps of depositing and patterning a conductive gate layer and forming spacer structures on sidewalls of the conductive gate. The conductive gate layer ideally includes a polysilicon gate structure formed over a channel region of the semiconductor substrate. The formation of the spacer structures is accomplished by chemically vapor depositing a conformal electric layer and thereafter anisotropically etching the conformal dielectric layer to remove portions of the dielectric layer from planar regions of the semiconductor substrate. The step of implanting the heavily doped impurity distribution is suitably accomplished by implanting ions of arsenic, boron or phosphorous using an implant energy in the range of approximately 10 to 100 keV. The preferred process of annealing the semicoductor substrate includes the heating of the semiconductor substrate in an inert ambient maintained at a temperature of approximately 600° C. to 900° C. for a duration in the range of approximately 2 to 20 minutes. The implanting of the lightly doped source/drain region after the annealing typically results in a final junction depth of the lightly doped source/drain region that is less than approximately 0.1 microns.

BRIEF DESCRIPTION OF THE DRAWINGS

Other objects and advantages of the invention will become apparent upon reading the following detailed description and upon reference to the accompanying drawings in which.

Figure 1:
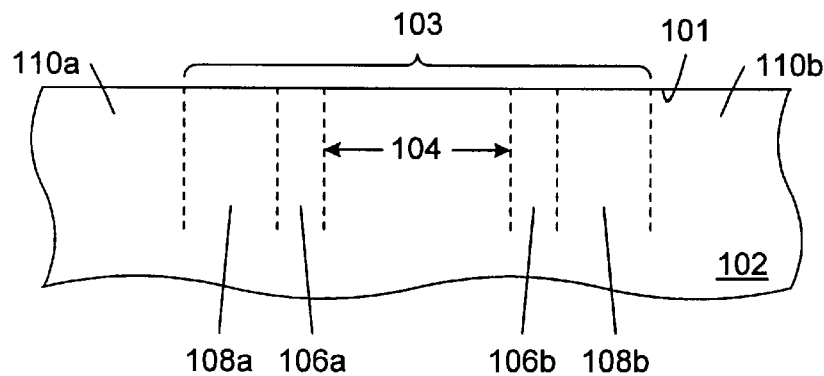
FIG. 1 is a partial cross-sectional view of semiconductor substrate including a channel region between two lightly doped regions between two heavily doped regions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIGS. 1 through 9 show a presently preferred process for forming LDD transistors in accordance with the present invention. Referring to FIG. 1 conductor substrate 102 is provided. Semiconductor substrate 102 includes active region 103 laterally displaced between a first isolation region 110a and a second isolation region 110b. Active region 103 includes a channel region 104 laterally displaced between first and second lightly doped regions 106a and 106b respectively. Lightly doped regions 106a and 106b are laterally displaced between first and second heavily doped regions 108a and 108b. Semiconductor substrate 102 typically comprises a single crystal silicon wafer as is well known in the field of semiconductor processing. In a presently preferred embodiment useful in the manufacturing of CMOS integrated circuits, semiconductor substrate 102 includes a p-type epitaxial layer formed over a p+ silicon bulk. A preferred resistivity of the p-type epitaxial layer is in the range of approximately 10 to 15 Ω-cm. The p+ silicon bulk includes a p-type dopant such as boron present in a concentration greater than approximately $10^{19}$ atoms/cm$^3$. Semiconductor substrate 102 includes a substantially planar upper surface 101.

Figure 2:
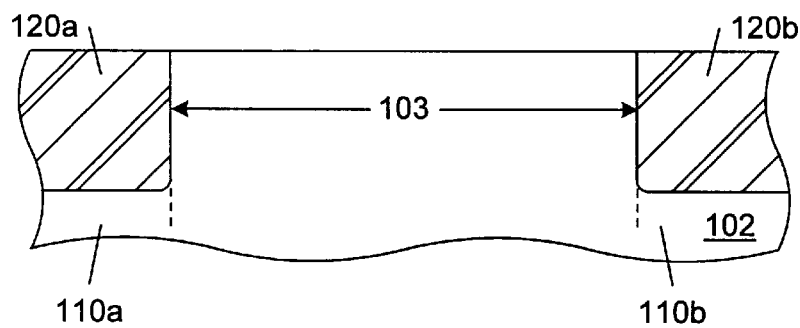
FIG. 2 is a processing step subsequent to FIG. 1 in which isolation structures have been formed in the isolation regions of the semiconductor substrate.

Turning to FIG. 2, first and second isolation structures 120a and 120b are formed within first and second isolation regions 110a and 110b respectively. Isolation structures such as first and second isolation structure 120a and 120b provide electrical and physical isolation among the plurality of transistors formed within semiconductor substrate 102 in the typical integrated circuit. First and second isolation structures 120a and 120b as shown in FIG. 2 are of the shallow trench isolation variety. Shallow trench isolation structures are typically formed by etching a trench into the isolation regions of a semiconductor substrate and thereafter depositing a dielectric material such as CVD oxide into the trench. Prior to the deposition, a thermal oxidation process may be used to form a thermal dielectric liner in the isolation trench. After the trench is filled with a dielectric material, a planarization process is performed to remove portions of the deposited dielectric from regions exterior to the isolation trench. Although FIG. 2 discloses shallow trench isolation structures, it is to be understood that alternative isolation structures such as LOCOS or field oxide isolation structures can be used.

Figure 3:
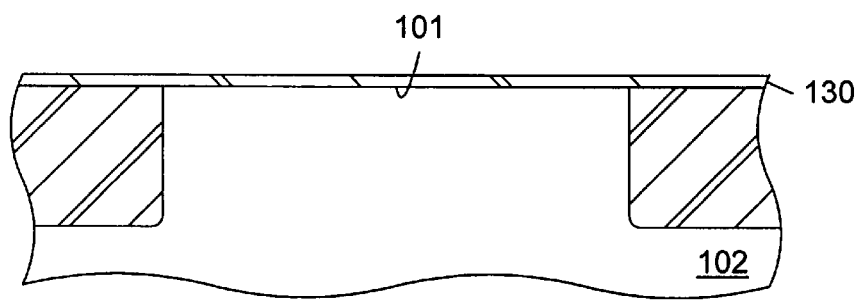
FIG. 3 is a processing step subsequent to FIG. 2 in which a gate dielectric has been formed on an upper surface of the semiconductor substrate.

Turning to FIG. 3, a gate dielectric layer 130 is formed over upper surface 101 of semiconductor substrate 102. In the preferred embodiment, gate dielectric 130 is formed by thermally oxidizing semiconductor substrate 102. Thermal oxidation of a silicon substrate such as the preferred embodiment of semiconductor substrate 102 results in the formation of a high quality oxide suitable for use as an insulation layer between the gate and the channel region of an MOS transistor. A preferred thermal oxidation process suitable for the growth of gate dielectric 130 involves immersing semiconductor substrate 102 in an oxygen bearing ambient maintained at a temperature in the range of approximately 600° C. to 900° C. for a duration in the range of approximately 2 to 20 minutes. A referred thickness of gate dielectric 130 suitable for use in deep submicron transistors is in the range of approximately 10 to 50 angstroms. It will be appreciated to those skilled in the art of semiconductor processing that the thermal oxidation of semiconductor substrate 102 may be accomplished in a conventional oxidation/diffusion furnace into which a plurality of wafers are immersed for simultaneous processing. Alternatively, gate dielectric 130 may be suitably grown using a rapid thermal apparatus. In a rapid thermal apparatus, a single wafer is subjected to a high temperature ambient for a duration that is typically shorter than the duration associated with oxidation furnaces.

Figure 4:
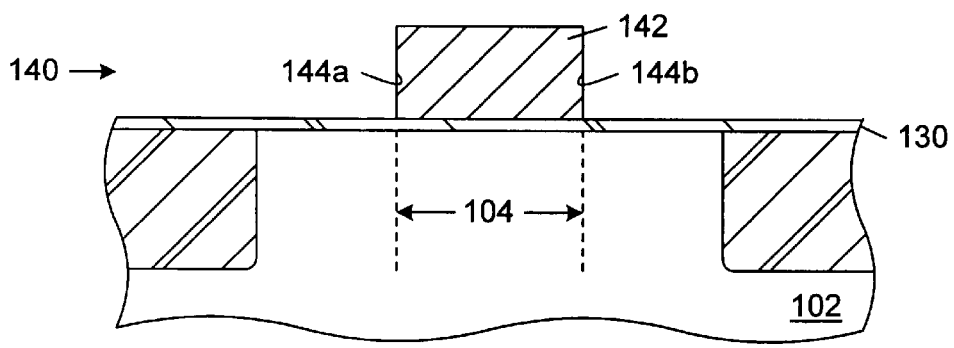
FIG. 4 is a processing step subsequent to FIG. 3 in which a conductive gate layer has been formed on the gate dielectric layer.

Turning to FIG. 4, a patterned gate layer 140 is formed on an upper surface of gate dielectric 130. Patterned gate layer 140 includes conductive gate structure 142 which is aligned over channel region 104 of semiconductor substrate 102. Preferably, the formation of patterned gate layer 140 is accomplished by depositing a polysilicon layer on gate dielectric 130 and thereafter patterning the polysilicon layer with a conventional photolithography masking sequence and an appropriate wet or dry etch process. In a presently preferred polysilicon process, the deposition of the polysilicon layer is accomplished by thermally decomposing silane in a chemical vapor depositing reactor chamber. The reactor chamber is preferably maintained at a temperature in the range of approximately 580° C. to 650° C. and a pressure of less than approximately 2 torr. After the deposition, patterning of the polysilicon layer is achieved by forming a conventional photoresist mask over the polysilicon layer such that the photoresist pattern is aligned over channel region 104 of semiconductor substrate 102. The subsequent etching of the polysilicon layer, in a presently preferred embodiment, is achieved by adding chlorine to a fluorine bearing plasma. The patterning of the polysilicon layer preferably results in the formation of first and second sidewalls 144a and 144b of conductive gate structure 142. Ideally, first and second sidewalls 144a and 144b are substantially perpendicular to upper surface 101 of semiconductor substrate 102 and are aligned over boundaries of channel region 104. Conductive gate structure may be doped with an impurity distribution to reduce the sheet resistivity.

Figure 5:
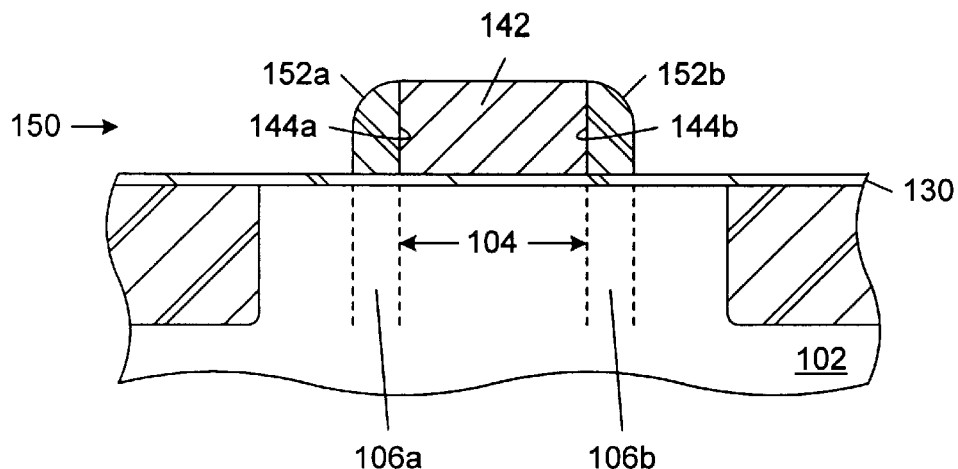
FIG. 5 is a processing step subsequent to FIG. 4 in which spacer structures have been form on sidewalls of a conductive gate.

Turning to FIG. 5, first patterned layer 150 is formed on gate dielectric 130. First patterned layer 150 includes conductive gate structure 142 and first and second spacer structures 152a and 152b. First and second spacer structures 152a and 152b extend laterally from first and second sidewalls 144a and 144b, respectively of conductive gate structure 142. First and second spacer structures 152a and 152b provide a cover or mask for first and second lightly doped regions 106a and 106b of semiconductor substrate 102. A projected range characteristic of spacer structures 152 is greater than a projected range characteristic of conductive gate structure 142. For purposes of this disclosure, the projected range characteristic of a given material refers to the average distance traveled by a plurality of ions implanted into the material at a given implant energy. If material A has a higher or longer projected range characteristic than material B, then the average ion implanted into material A will travel a greater distance into material A before coming to rest than the average ion implanted into material B. The present application contemplates the beneficial use of differential projected range characteristics between different materials to act as an implant mask. In an embodiment in which conductive gate structure 142 comprises polysilicon, spacer structures 152 may be suitably formed of CVD oxide. In a preferred process sequence, the formation of spacer structures 152 is accomplished by depositing a conformal dielectric layer over the topography defined by conductive gate structure 142 and upper surface 101 of semiconductor substrate 102. Thereafter, conformal dielectric layer is anisotropically etched until the portions of the conformal dielectric layer in planar regions of the topography are just removed. The planar region of the topography refer to regions of the topography substantially parallel to upper surface 101 of semiconductor substrate 102. By using an anisotropic etch process with a minimum overetch cycle, the spacer etch results in the removal of portions of the conformal dielectric layer in the horizontal or planar regions while leaving behind spacer structures 152 along sidewalls 144 of gate structure 142. In a presently preferred embodiment, the deposition of the conformal dielectric layer is accomplished by decomposing TEOS in a CVD reactor chamber maintained at a temperature less than approximately 650° C. For details of the process considerations in the formation of sidewall structures, see S. H. Dhong and E. J. Petrillo, *Sidewall Spacer Technology for MOS and Bi-Polar Devices*, Journal of the Electro-Chemical Society, February 1986, page 389.

Figure 6:
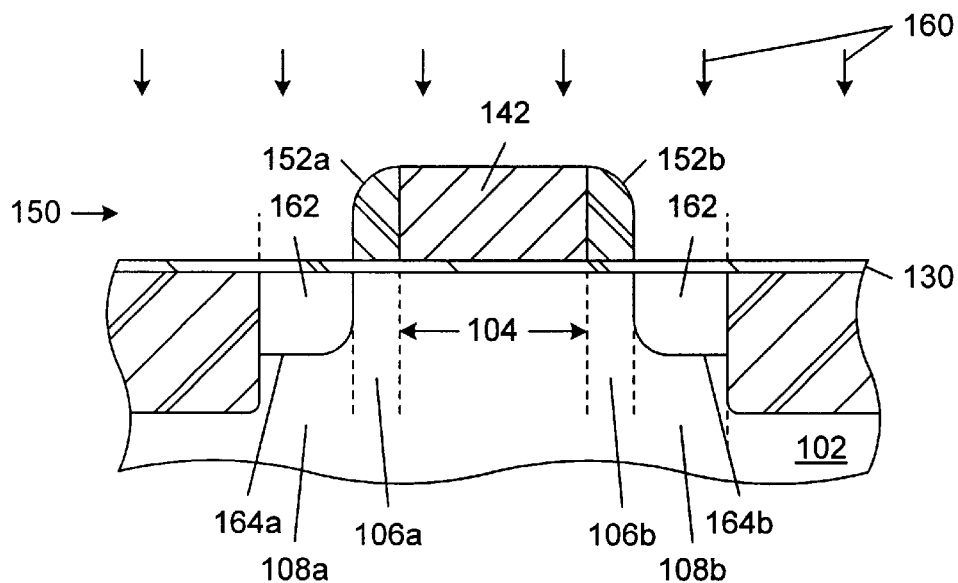
FIG. 6 is a processing step subsequent to FIG. 5 in which heavily doped impurity distribution is introduced into the semiconductor substrate.

Turning to FIG. 6, a heavily dope first impurity distribution 162 is introduced into first and second source/drain regions 164a and 164b. Preferably the introduction of heavily dope impurity distribution 162 is accomplished using an ion implantation step represented in FIG. 6 as reference numeral 160. In the preferred embodiment, ion implantation 160 implants ions of boron, arsenic, or phosphorous into heavily doped source/drain regions 164 using an implant energy in the range of approximately 10 to 100 keV and an implant dose of approximately $10^{14}$ to $10^{16}$ atoms/cm$^2$. The introduction of heavily dope impurity distribution into semiconductor substrate 102 in the presence of first patterned layer 150 substantially prevents heavily doped impurity distribution 162 from entering channel region 104 or lightly doped regions 106 of semiconductor substrate 102.

Although the projected range characteristics of spacer structures 152 is different than the projected range characteristic of conductive gate 142, the implant energy preferably used for ion implantation step 160 is adjusted such that both the spacer structures and the conductive gate structure provide an adequate blocking mechanism.

Figure 7:
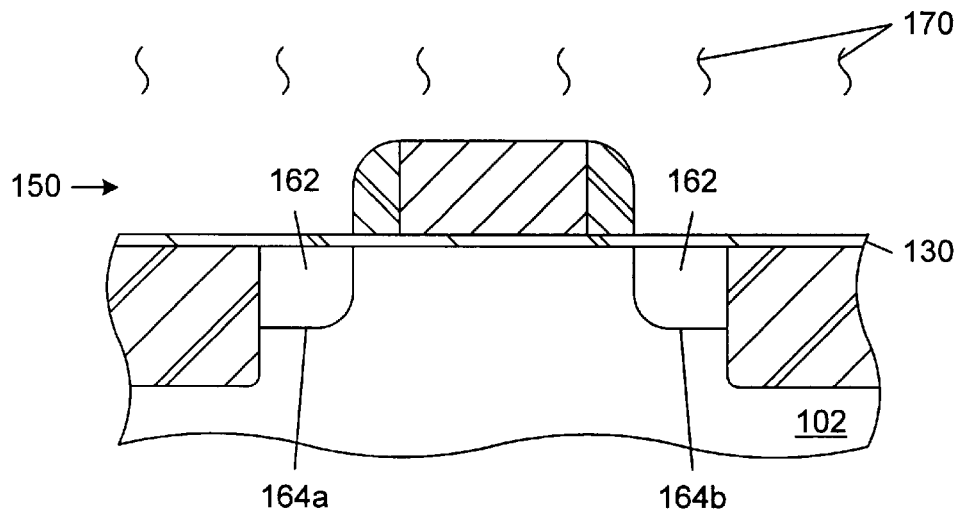
FIG. 7 is a processing step subsequent to FIG. 6 in which the semiconductor substrate is annealed.

Turning to FIG. 7, the anneal cycle represented as reference numeral 170 is performed to repair damage to gate dielectric 130 and semiconductor substrate 102 caused by ion implantation 160 and to activate and partially redistribute heavily doped impurity distribution 162 within heavily doped source/drain regions 164 of semiconductor substrate 102. Anneal cycle 170 is suitably accomplished by immersing semiconductor substrate 102 into an inert ambient maintained at a temperature in the range of approximately 600° C. to 900° C. for a duration in the range of approximately 2 to 20 minutes. In the present application, in which it is desired to fabricate a source/drain region with a minimum junction depth, it is preferable to perform the anneal cycle prior to the introduction of the shallow source/drain impurity distribution to minimize the subsequent processing temperature to which the lightly doped impurity distribution is subjected. The present invention contemplates the annealing of the heavily doped distribution.

Figure 8:
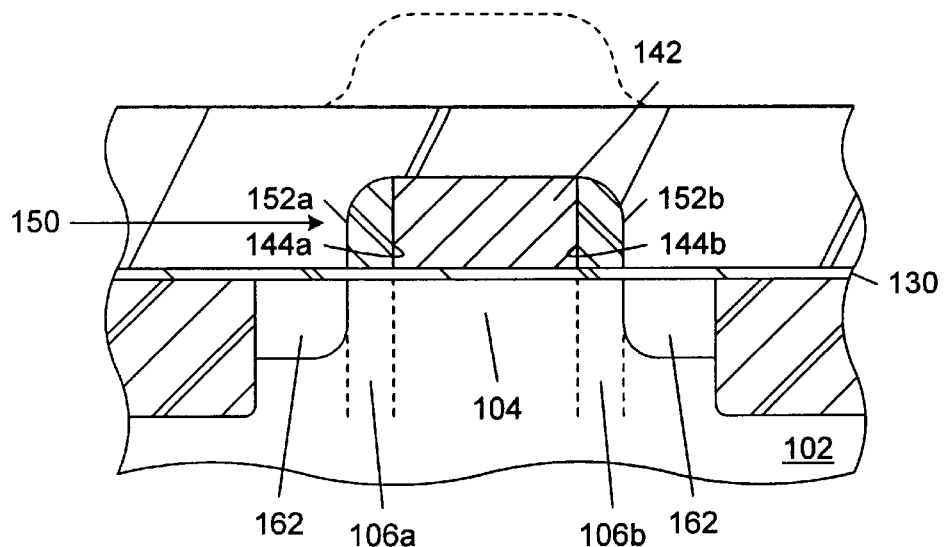
FIG. 8 is processing step subsequent to FIG. 7 in which an interlevel dielectric level is deposited on the semiconductor substrate topography.

Turning to FIG. 8, an interlevel dielectric layer 180 is deposited upon the topography defined by first patterned layer 150 and semiconductor substrate 102. Preferably, the deposition of interlevel dielectric layer 180 comprises thermally decomposing TELOS in a CVD reactor chamber maintained at a temperature less than approximately 650° C. Subsequent to the deposition of interlevel dielectric layer 180, a planarization process is typically performed to produced a substantially planar upper surface 182 of interlevel dielectric 180. Portions of interlevel dielectric layer 180 removed during this planarization process are shown in phantom in FIG. 8. A suitable planarization process for producing substantially planar upper surface 182 includes chemical mechanical polishing, possibly in combination with wet or dry etch processes. A projected range characteristic of interlevel dielectric layer 180 is approximate equal to a projected range characteristic of spacer structures 152. The approximately equality of the projected range characteristics of spacer structures 152 and interlevel dielectric 180 combined with the lower projected range characteristic of conductive gate structure 142 effectively forms an implantation mask that can prevent the subsequent implant from entering channel region 104 aligned under conductive gate structure 142 while permitting the implanted species to enter the remaining areas of semiconductor substrate 102. In other words, because the projected range characteristics of interlevel dielectric level 180 and spacer structures 152 are approximately equal, the spacer structures are effectively transparent a subsequent implant while conductive gate structure 142 provides an implant mask. Using this method, it is unnecessary to engage in the relatively complicated process of removing spacer structures 152 from sidewalls 144 of conductive gate structure 142 in an effort to expose lightly doped regions 106 of semiconductor substrate 102. The proximity of spacer structures 152 to gate dielectric 130 located within channel region 104 of semiconductor substrate 102 and the typical similarity of material between spacer structures 152 and gate dielectric 130 ensures that any attempt to remove spacer structures 152 will result in some removal of portions of gate dielectric 130 with a corresponding decrease in gate dielectric quality. By utilizing the differential projected range characteristics of conductive gate 142 and interlevel dielectric 180, the present invention accomplishes the post anneal introduction of lightly doped source/drain regions into semiconductor substrate 102 without removing spacer structures 152 from sidwalls 144 of conductive gate 142.

Figure 9:
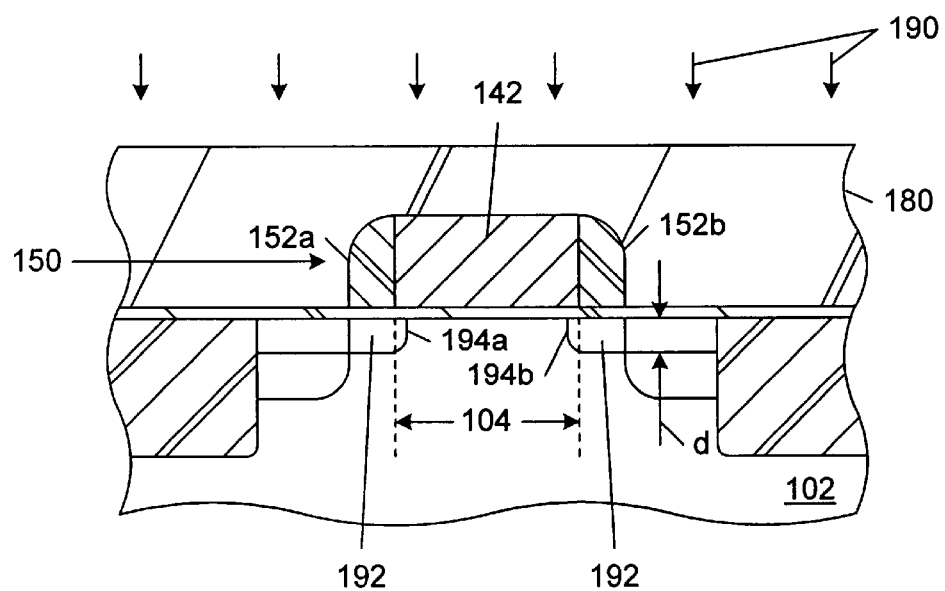
FIG. 9 is processing step subsequent to FIG. 8 in which a lightly doped impurity distribution is introduced into the semiconductor substrate.
Figure 10:
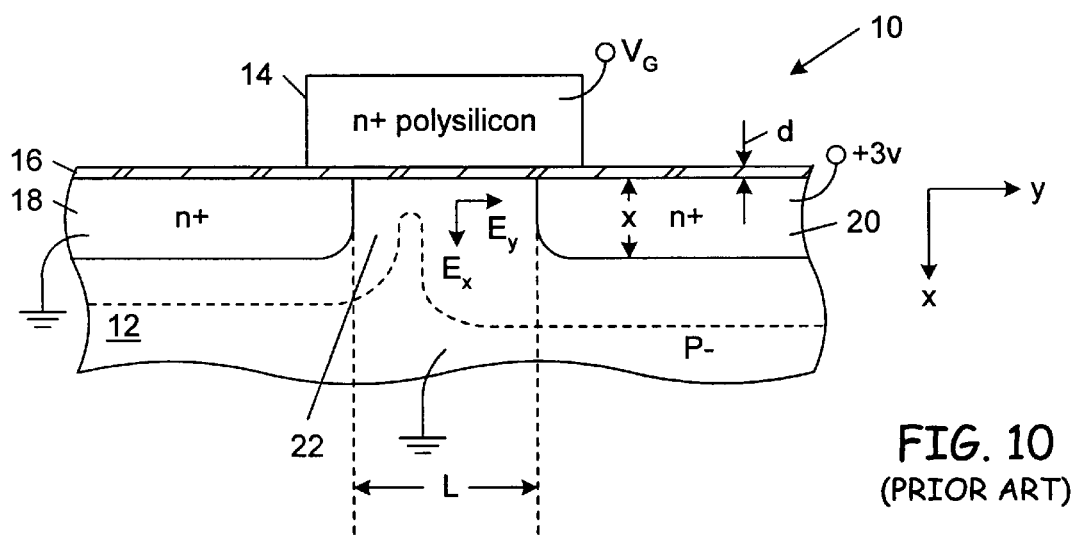
FIG. 10 is a partial cross-sectional view of an n-channel MOS transistor.

Turning now to FIG. 9, a lightly doped impurity distribution 192 is introduced into first and second lightly doped source/drain regions 194a and 194b. Preferably, the introduction of lightly doped impurity distribution 192 into semiconductor substrate 102 is accomplished using ion implantation represented in FIG. 9 as reference numeral 190. The simultaneous presence of first patterned layer 150 and interlevel dielectric 180 during ion implantation 190 results in the selective masking of ion implantation 190 to substantially prevent impurity distribution 192 from entering channel region 104 of semiconductor substrate 102. The lower projected range characteristic of conductive gate structure 142 provides an effective blocking or masking mechanism over channel regions 104 of semiconductor substrate 102. The approximate equality of the projected range characteristic of spacer structures 152 and interlevel dielectric 180 render spacer structures 152 effectively transparent to implant 190. In a presently preferred embodiment implant 190 is performed using an implant dose in the range of approximately $10^{12}$ to $10^{15}$ atoms/cm$^2$ and an energy in the range of approximately 10 to 100 keV. The thickness of dielectric layer 180 (after planarization) and the implant energy are preferably adjusted such that a depth d of lightly doped source/drain regions 194 is less than approximately 0.1 microns. It is theorized that the presence of interlevel dielectric layer 180 during ion implantation 190 minimizes lattice damage to semiconductor substrate 102 eliminating the need for a high temperature anneal step following ion implantation 190. Accordingly, if subsequent processing temperatures are adequately controlled, it is possible that lightly doped impurity distribution 192 may be subjected to no temperature greater than approximately 800° C. By minimizing the temperatures to which lightly doped impurity distribution 192 is subjected, the depth d of lightly doped source/drain regions 194 is essentially maintained at its post implant value and accordingly, the junction depth is minimized.

It will be appreciated to those skilled in the art that the present invention contemplates the formation of a extremely shallow source/drain region within an MOS transistor. Various modification, and changes may be made to each and every processing step as would be obvious to a person skilled in the art having the benefit of this disclosure. It is intended that the following claims be interpreted to embrace all such modification and changes and, accordingly, the specification and drawings are to be regarded in a illustrative rather than a restrictive sense.

What is claimed is:

1. In a semiconductor manufacturing process, a source/drain fabrication method comprising:

providing a semiconductor substrate, wherein said semiconductor substrate includes a channel region laterally displaced between first and second lightly doped regions, and wherein said first and second lightly doped regions are laterally displaced between first and second heavily doped regions;

forming a gate dielectric on an upper surface of said semiconductor substrate;

forming a conductive gate structure on said gate dielectric, wherein said conductive gate structure is aligned over said channel region of said semiconductor substrate;

forming first and second spacer structures on first and second sidewalls, respectively, of said conductive gate structure, wherein said first and second spacer structures extend laterally from said first and second sidewalls of said conductive gate structure, respectively, such that said first and second spacer structures cover said first and second lightly doped regions of said semiconductor substrate, and wherein a projected range characteristic of said first and second spacer structures is greater than a projected range characteristic of said conductive gate structure;

introducing a first impurity distribution into said semiconductor substrate, wherein the presence of said first and second spacer structures during said introducing substantially prevents said first impurity distribution from entering said first and second lightly doped regions;

depositing a interlevel dielectric layer on a topography defined by said upper surface of said semiconductor substrate, said first and second spacer structures, said gate dielectric, and said conductive gate structure and, thereafter, planarizing said interlevel dielectric layer, and wherein a projected range characteristic of said interlevel dielectric layer is approximately equal to said projected range characteristic of said first and second spacer structures; and implanting a second impurity distribution into said semiconductor substrate through said interlevel dielectric layer and said first and second spacer structures, wherein said projected range characteristic of said conductive gate structures being less than said projected range characteristic of said first and second spacer structures substantially prevents said second impurity distribution from entering said channel region of said semiconductor substrate.

2. The method of claim 1, wherein said semiconductor substrate comprises a p-type silicon epitaxial layer formed on an upper surface of a p+ silicon bulk, and wherein a resistivity of said p-type silicon epitaxial layer is in the range of approximately 10 to 15 $\Omega$-cm.

3. The method of claim 1, wherein said forming said gate dielectric comprises growing a thermal oxide on said upper surface of said semiconductor substrate.

4. The method of claim 1, wherein said forming said conductive gate structure comprises depositing a polysilicon layer on an upper surface of said gate dielectric and patterning the polysilicon layer with a photolithography and etch sequence.

5. The method of claim 1, wherein said forming said first and second spacer structures comprises:

depositing a conformal dielectric layer on a topography defined by said conductive gate structure and said upper surface of said semiconductor substrate; and anisotropically etching said conformal dielectric layer to remove portions of said conformal dielectric layer in planar regions of said topography.

6. The method of claim 5, wherein said depositing said conformal dielectric layer comprises decomposing TEOS in a chemical vapor deposition reactor chamber maintained at a temperature less than approximately 650° C.

7. The method of claim 1, wherein a depth of said second impurity distribution is less than approximately 0.1 microns.

8. A MOS semiconductor process comprising:

forming a gate layer on a semiconductor substrate, wherein said gate layer includes a gate dielectric layer formed on an upper surface of said semiconductor substrate and a conductive gate structure formed on an upper surface of said gate dielectric layer aligned over a channel region of said semiconductor substrate;

forming spacer structures on sidewalls of said conductive gate structure, wherein said space structures cover lightly doped regions of said semiconductor substrate laterally displaced on either side of said channel region;

implanting a heavily doped impurity distribution into heavily doped regions within said semiconductor substrate laterally displaced on either side of said lightly doped regions;

annealing said semiconductor substrate to activate said heavily doped impurity distribution;

depositing an interlevel dielectric layer on a topography defined by said semiconductor substrate, said gate layer, and said spacer structures; and implanting a lightly doped impurity distribution into said lightly doped regions of said semiconductor substrate through said interlevel dielectric layer and said spacer structures, wherein said implanting said lightly doped impurity distribution occurs after said annealing of said semiconductor substrate and without removing said spacer structures.

9. The process of claim 8, wherein said forming said gate layer comprises:

depositing polysilicon on said upper surface of said gate dielectric layer by thermally decomposing silane in a chemical vapor deposition reactor chamber maintained at a temperature in the range of approximately 580 to 650° C. and a pressure less than approximately 2 torr; and patterning the polysilicon with a photolithography masking step followed by a silicon etch step.

10. The process of claim 8, wherein said implanting of said heavily doped impurity distribution is performed with an implant energy in the range of approximately 10 to 100 keV and an implant dose in the range of approximately $10^{13}$ to $10^{17}$ atoms/cm$^2$.

11. The process of claim 8, wherein said annealing comprises immersing said semiconductor substrate in an inert-ambient maintained at a temperature in the rage of approximately 600 to 900° C. for a duration in the range of approximately 2 to 20 minutes.

12. The process of claim 8, wherein said depositing said interlevel dielectric layer comprises decomposing TEOS in a CVD reactor chamber maintained at a temperature less than approximately 650° C. and a pressure less than approximately 2 torr.

13. A method of forming shallow, lightly doped source/drain structures comprising:

forming a first patterned layer on an upper surface of a semiconductor substrate, wherein said first patterned layer comprises a conductive gate aligned over a channel region of said semiconductor substrate and first and second spacer structures formed on respective sidewalls of said conductive gate and aligned over first and second lightly doped regions of said semiconductor substrate, wherein said first and second lightly doped regions are laterally displaced on either side of said channel region, and wherein a projected range characteristic of said conductive gate is less than a projected range characteristic of said first and second spacer structures;

implanting a heavily doped impurity distribution into said semiconductor substrate, wherein the presence of said first patterned layer during said implanting masks said channel region and said first and second lightly doped regions of said semiconductor substrate;

depositing an interlevel dielectric on said first patterned layer and planarizing said interlevel dielectric, and wherein a projected range characteristic of said interlevel dielectric is approximately equal to said projected range characteristic of said first and second spacer structures;

annealing said semiconductor substrate; and implanting a lightly doped impurity distribution into said semiconductor substrate through said interlevel dielectric and said first and second spacer structures, wherein said projected range characteristic of said conductive gate structure being less than said projected range characteristic of said first and second spacer structures substantially prevents said lightly doped impurity distribution from entering said channel region of said semiconductor substrate, whereby said implanting said lightly doped impurity distribution into said semiconductor substrate occurs after said annealing of said semiconductor substrate and without removing said spacer structures.

14. The method of claim 13, wherein said forming said first patterned layer comprises:

depositing and patterning said conductive gate, wherein said conductive gate includes a polysilicon gate structure formed over said channel region of said semiconductor substrate; and forming said first and second spacer structures on said sidewalls of said conductive gate, wherein said forming said first and second spacer structures comprises chemically vapor depositing a conformal dielectric layer and, thereafter, anisotropically etching said conformal dielectric layer to remove portions of said conformal dielectric layer from planar regions of said semiconductor substrate.

15. The method of claim 13, wherein said implanting said heavily doped impurity distribution into said semiconductor substrate comprises implanting ions selected from the group consisting of arsenic, boron, and phosphorous wherein an implant energy is in the range of approximately 10 to 100 keV.

16. The method of claim 13, wherein said annealing said semiconductor substrate comprises heating said semiconductor substrate in an inert ambient maintained at a temperature of approximately 600 to 900° C. for a duration in the range of approximately 2 to 20 minutes.

17. The method of claim 13, wherein said implanting of said lightly doped impurity distribution after said annealing results in a final junction depth of said lightly doped impurity distribution less than approximately 0.1 microns.

* * * * *

UNITED STATES PATENT AND TRADEMARK OFFICE
CERTIFICATE OF CORRECTION

PATENT NO. : 5,989,964

DATED : November 23, 1999

INVENTOR(S) : Gardner et al.

It is certified that error appears in the above-identified patent and that said Letters Patent is hereby corrected as shown below:

Claim 11, col. 12, line 42 please delete "rage" and substitute --range--.

Signed and Sealed this

Eleventh Day of July, 2000

Attest:

Q. TODD DICKINSON

*Attesting Officer*           *Director of Patents and Trademarks*